United States Patent
Zhang et al.

(10) Patent No.: US 10,091,918 B2
(45) Date of Patent: Oct. 2, 2018

(54) METHODS AND APPARATUS FOR CONFORMAL SHIELDING

(71) Applicant: QUALCOMM Incorporated, San Diego, CA (US)

(72) Inventors: Yang Zhang, San Diego, CA (US); Jack Brian Steenstra, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 246 days.

(21) Appl. No.: 14/038,633

(22) Filed: Sep. 26, 2013

(65) Prior Publication Data

US 2014/0160699 A1 Jun. 12, 2014

Related U.S. Application Data

(60) Provisional application No. 61/735,699, filed on Dec. 11, 2012.

(51) Int. Cl.
*H05K 13/00* (2006.01)
*H01L 23/552* (2006.01)
(Continued)

(52) U.S. Cl.
CPC ........... *H05K 13/00* (2013.01); *H01L 23/552* (2013.01); *H05K 1/0218* (2013.01); *H05K 3/284* (2013.01);
(Continued)

(58) Field of Classification Search
CPC .... H05K 3/284; H05K 1/0218; H05K 9/0024; H05K 2203/1316; H05K 2203/0169;
(Continued)

(56) References Cited

U.S. PATENT DOCUMENTS 5,153,379 A 10/1992 Guzuk et al.
5,354,951 A * 10/1994 Lange, Sr. ........... H05K 9/0032
174/372

(Continued)

FOREIGN PATENT DOCUMENTS

CN 1774965 A 5/2006
DE 102007035181 A1 1/2009
(Continued)

OTHER PUBLICATIONS

International Search Report and Written Opinion—PCT/US2013/072478—ISA/EPO—dated Apr. 10, 2014.

*Primary Examiner* — Dimary Lopez Cruz
*Assistant Examiner* — Abhishek Rathod
(74) *Attorney, Agent, or Firm* — Weaver Austin Villeneuve & Sampson LLP

(57) ABSTRACT

Methods and apparatus for providing conformal shielding are disclosed to provide electromagnetic interference shielding of circuit components mounted on a circuit board. A print mold stencil is provided with one or more conductive shielding walls disposed within the stencil before its application to the circuit board and detachable therefrom, and also configured to encompass the circuit components. In this manner a shielded compartment volume is defined by walls of the print mold stencil and one or more of the conductive shielding walls, and may be easily and quickly applied to the circuit board to encompass the components for shielding. A conformal shielding layer is then formed from a molding material disposed in the shielded compartment volume that encompasses the components, as well as a conductive layer disposed on the outer surface of the material, and coupling of the shielding walls with a ground plane in the circuit board.

11 Claims, 7 Drawing Sheets

(51) Int. Cl.
*H05K 1/02* (2006.01)
*H05K 9/00* (2006.01)
*H05K 3/28* (2006.01)

(52) U.S. Cl.
CPC .... *H05K 9/0024* (2013.01); *H01L 2924/0002* (2013.01); *H05K 2201/0715* (2013.01); *H05K 2203/0169* (2013.01); *H05K 2203/1316* (2013.01)

(58) Field of Classification Search
CPC ............ H05K 2201/0715; H05K 13/00; H01L 23/552; H01L 2924/0002; H01L 2924/00
See application file for complete search history.

(56) References Cited

U.S. PATENT DOCUMENTS

| | | | | |
|---|---|---|---|---|
| 5,566,052 | A * | 10/1996 | Hughes | H01L 23/367 |
| | | | | 174/354 |
| 6,121,546 | A * | 9/2000 | Erickson | H05K 9/0032 |
| | | | | 174/366 |
| 7,005,573 | B2 | 2/2006 | Lionetta et al. | |
| 7,876,579 | B1 * | 1/2011 | Tsau | H05K 9/0032 |
| | | | | 361/816 |
| 8,199,518 | B1 * | 6/2012 | Chun | H01L 23/49811 |
| | | | | 361/767 |
| 2005/0250246 | A1 | 11/2005 | Ogasawara et al. | |
| 2006/0258050 | A1 * | 11/2006 | Fujiwara | H01L 23/29 |
| | | | | 438/112 |
| 2007/0246825 | A1 | 10/2007 | Oh et al. | |
| 2009/0032300 | A1 | 2/2009 | Joshi | |
| 2009/0211802 | A1 * | 8/2009 | Poulsen | H05K 9/0026 |
| | | | | 174/384 |
| 2010/0157566 | A1 | 6/2010 | Bogursky et al. | |
| 2011/0299262 | A1 * | 12/2011 | Crotty | H01R 13/6271 |
| | | | | 361/818 |
| 2012/0008288 | A1 | 1/2012 | Tsukamoto et al. | |
| 2012/0112327 | A1 | 5/2012 | Pagaila et al. | |
| 2012/0120613 | A1 | 5/2012 | Kuwabara et al. | |

FOREIGN PATENT DOCUMENTS

| | | |
|---|---|---|
| EP | 1631137 A1 | 3/2006 |
| JP | 2003069196 A | 3/2003 |
| JP | 2007294965 A | 11/2007 |
| JP | 2012190960 A | 10/2012 |
| JP | 2012209419 A | 10/2012 |
| WO | 2011007570 A1 | 1/2011 |

\* cited by examiner

METHODS AND APPARATUS FOR CONFORMAL SHIELDING

CLAIM OF PRIORITY UNDER 35 U.S.C. § 119

The present Application for Patent claims priority to Provisional Application No. 61/735,699 entitled "METHOD OF CONFORMAL SHIELDING AND ELECTRICAL DEVICE FORMED THEREFROM" filed Dec. 11, 2012, and assigned to the assignee hereof and hereby expressly incorporated by reference herein.

BACKGROUND

Field

The present disclosure relates generally to methods and apparatus for conformal shielding, and more specifically to conformal shielding utilizing a removable stencil and shielding walls embedded within the stencil to more efficiently engender shielding for surface mounted circuit devices on a printed circuit board.

Background

An electrical device, such as a computing or communication device, typically includes a printed circuit board (PCB) having various circuit components to enable the functionality of the electrical device. Such circuit components may be referred to as an integrated circuit, chip, or microchip, and may be mounted on the surface of a PCB. These chips may be referred to as surface mount technology (SMT) components. In cases where all components of a computer or other electronic system, such as a wireless phone, are integrated into a single chip, the single chip may be referred to as a system on a chip (SoC).

Various circuit components in devices, such as wireless devices, may generate electromagnetic interference (EMI), or may be sensitive to EMI from other components or from EMI originating outside of the device. Accordingly, these circuit components may need to be shielded to either contain generated EMI or protect against outside EMI. Due to the constant demand to make electrical devices smaller, however, there is a desire to reduce the area and thickness of chips within these devices.

In some solutions, conformal shielding is utilized to address the above concerns. Conformal shielding for wireless devices has many advantages, including better shielding efficacy, minimization of device height, and help with heat conduction. Currently, there are two conventional conformal shielding approaches. In the first approach, a metal frame acting as a shielding wall is applied to the PCB when the SMT components are mounted. This approach typically requires a relatively large surface area on the PCB to allow the metal frame to be mounted due to large tolerances in the placement accuracy of the metal frame and SMT. After mounting of the metal frame, a laser may then be used to expose the metal frame so that metallic paint can be subsequently applied to the mold to complete the shielding compartments. In a second conformal shielding approach, a laser is used to etch or scribe the molding material to form trenches. A conductive gel material is then applied into the trenches to form the shielding walls, and finally metallic paint is applied to the mold to achieve the shielding. Both processes are time consuming and involve many processes of repeated cleanings and baking and drying.

Thus, improvements in conformal shielding are desired.

SUMMARY

According to an aspect, a method of making a conformal interference shielding structure is disclosed. The method includes positioning at least one electrically conductive shielding wall within a print mold stencil to define at least one shielded area, and positioning the at least one print mold stencil on a circuit board configured for having circuit components mounted thereon. The print mold stencil is configured to be fillable in at least a portion defined with the at least one shielding wall with a molding material such that at least one of the circuit components in the at least one shielded area may be encapsulated by a volume of the molding material. With this methodology, by providing a print mold stencil having shielding walls embedded therein, quick disposition or locating of the shielding walls on the circuit immediately prior to print molding is afforded.

In another disclosed aspect, an apparatus for providing conformal electromagnetic interference shielding is taught. The apparatus includes at least one print mold stencil defining an interior volume for receiving molding material for conformal shielding of one or more circuit components disposed on a circuit board. The stencil includes one or more electrically conductive shielding walls disposed in the interior volume of the stencil, the at least one stencil configured to be removably disposed on a surface of the circuit board and to encompass the one or more circuit components. Furthermore, the one or more electrically conductive shielding walls are configured to electrically couple with the circuit board and to be detachable from the at least one print mold stencil.

In still a further aspect, an apparatus for providing conformal shielding is disclosed. The apparatus includes a circuit board and a circuit component mounted on the circuit board and having a body that extends from the circuit board. The apparatus further includes a shielded compartment connected to the circuit board and encompassing the body of the circuit component, wherein the shielded compartment comprises a molding material, a shielding layer, and at least one shielding wall. The shielding compartment is formed using a removably positioned print mold stencil configured with the at least one shielding wall antecedently disposed therein, the molding material is formed from the print mold stencil, and the shielding layer is disposed on a surface of the molding material and in electrical contact with the at least one shielding wall. Furthermore, the molding material encompasses at least a portion of the body of the circuit component and is integrally formed on the circuit board with the at least one shielding wall.

In still one further aspect, an apparatus for providing conformal shielding is disclosed. The apparatus includes a circuit board and a plurality of circuit components mounted on the circuit board. Further, the apparatus features a plurality of shielded compartments connected to the circuit board, each of the plurality of shielded compartments encompassing one or more circuit components of the plurality of circuit components, wherein each of the plurality of shielded compartments comprises a molding material, at least one shielding wall within a portion of the molding material, and a shielding material layer disposed on at least a portion of the molding material and electrical coupled with a portion of the at least one shielding wall. Additionally, each of the plurality of shielded compartments is formed using at least one removable print mold stencil configured with the at least one shielding wall previously disposed therein, and the molding material encompasses at least a portion of the body of at least one circuit component and is integrally formed on the circuit board with the at least one shielding wall.

DETAILED DESCRIPTION

The presently disclosed apparatus and methods afford simplified conformal shielding wherein interference shielding walls are applied to a printed circuit board (PCB) by being embedded within a print mold stencil (e.g., placed in the print mold stencil beforehand or antecedently disposed therein), and thus the shielding walls may be quickly disposed on the PCB immediately prior to print molding. The apparatus and methods also maintain a same size advantage as conventional methods while reducing the cost of production.

Figure 1:
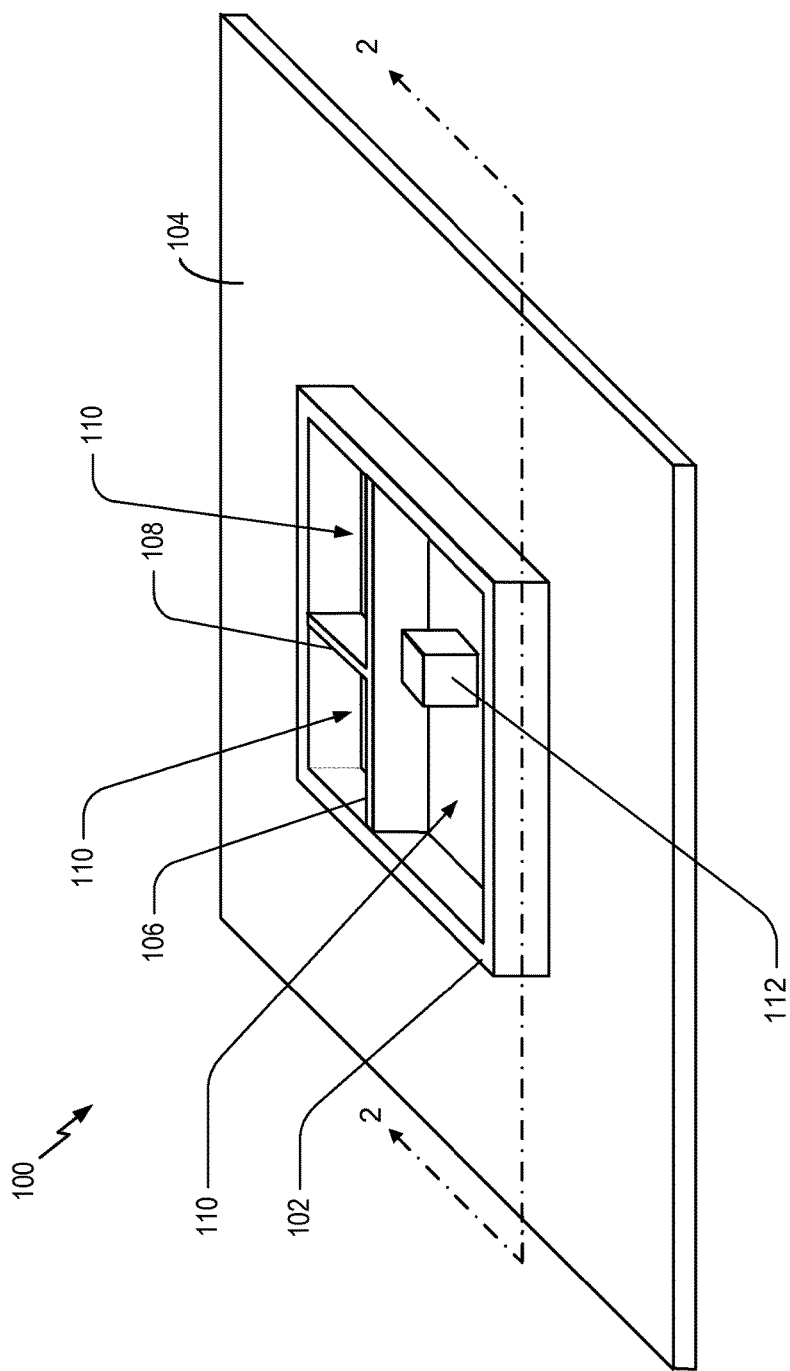
FIG. 1 is a trimetric view of an apparatus according to the present disclosure including a print mold stencil having one or more shielding walls embedded therein and disposed on a circuit board having one or more circuit components.

FIG. 1 illustrates a trimetric view of an apparatus 100 according to an aspect of the present disclosure that provides conformal shielding. Apparatus 100 includes a print mold stencil 102 that is disposed or positioned on a surface of a PCB 104. Stencil 102 includes one or more shielding walls 106, 108 embedded within the interior volume encompassed by the stencil 102. By embedding the shielding walls 106, 108 within the interior of the stencil 102, one or more interference shielding areas, volumes or compartments 110 are created within the interior volume of stencil 102. Although only three shielded volumes or compartments 110 are illustrated in FIG. 1 for simplicity of illustration, one skilled in the art will appreciate that either more or less compartments 110 may be formed with a larger or lesser number of shielding walls 106, 108.

Each shielding wall 106, 108, may be formed from an electrically conductive material such as, but not limited to, copper alloy (e.g., brilliant copper) or sheet metal in order to eventually form compartments shielding against electromagnetic interference (EMI), i.e., the walls, being electrically conductive, are used for forming an enclosed conductive surface (i.e., a Faraday cage). In an aspect, the shielding walls 106, 108 may be held within the print mold stencil 102 in a number of different ways, such as, but not limited to, a friction or force fit, a releasable connection, a fixed connection, an integral forming of walls 106, 108 with the stencil 102, or even a placement device configured to hold the shielding walls 106, 108 within the print mold stencil 102 in a desired relative orientation.

In an aspect, print mold stencil 102 may be positioned or disposed on circuit board 104 to encompass one or more circuit components within a shielded volume or compartment 110. FIG. 1 illustrates an exemplary circuit component 112, such as a surface mount technology (SMT) component, mounted to circuit board 104 and positioned within a shielded volume or compartment 110. Although only one circuit component 112 is illustrated in FIG. 1 for simplicity of illustration, those skilled in the art will appreciate that, in an aspect, multiple circuit components could be mounted to circuit board 104 respectively within each of the compartments 110. Additionally, circuit components within each compartment 110 may be either sources of EMI that need to be shielded to avoid interfering with other circuit components or are circuit components susceptible to EMI and in need of shielding from such interference.

In a further aspect, the stencil 102 may include means of alignment, such as, but not limited to, an alignment hole(s) or peg(s) (not shown) that couples with a complementary peg(s) or hole(s) (not shown) in the circuit board 104. Additionally, the stencil 102 and circuit board 104 may be configured complementary of one another, such that the stencil is disposed over particular traces, such as ground traces in circuit board 104. Although the stencil 102 would typically have the shielding walls 106, 108 embedded within its interior volume for quick application onto the circuit board 104 with stencil 102, in some aspects, one or more of the shielding walls 106, 108 could be separately and sequentially positioned on circuit board 104, where either print mold stencil 102 or at least one shielding wall 106, 108 may be positioned first, and then the other remaining component(s) positioned subsequently.

Figure 2:
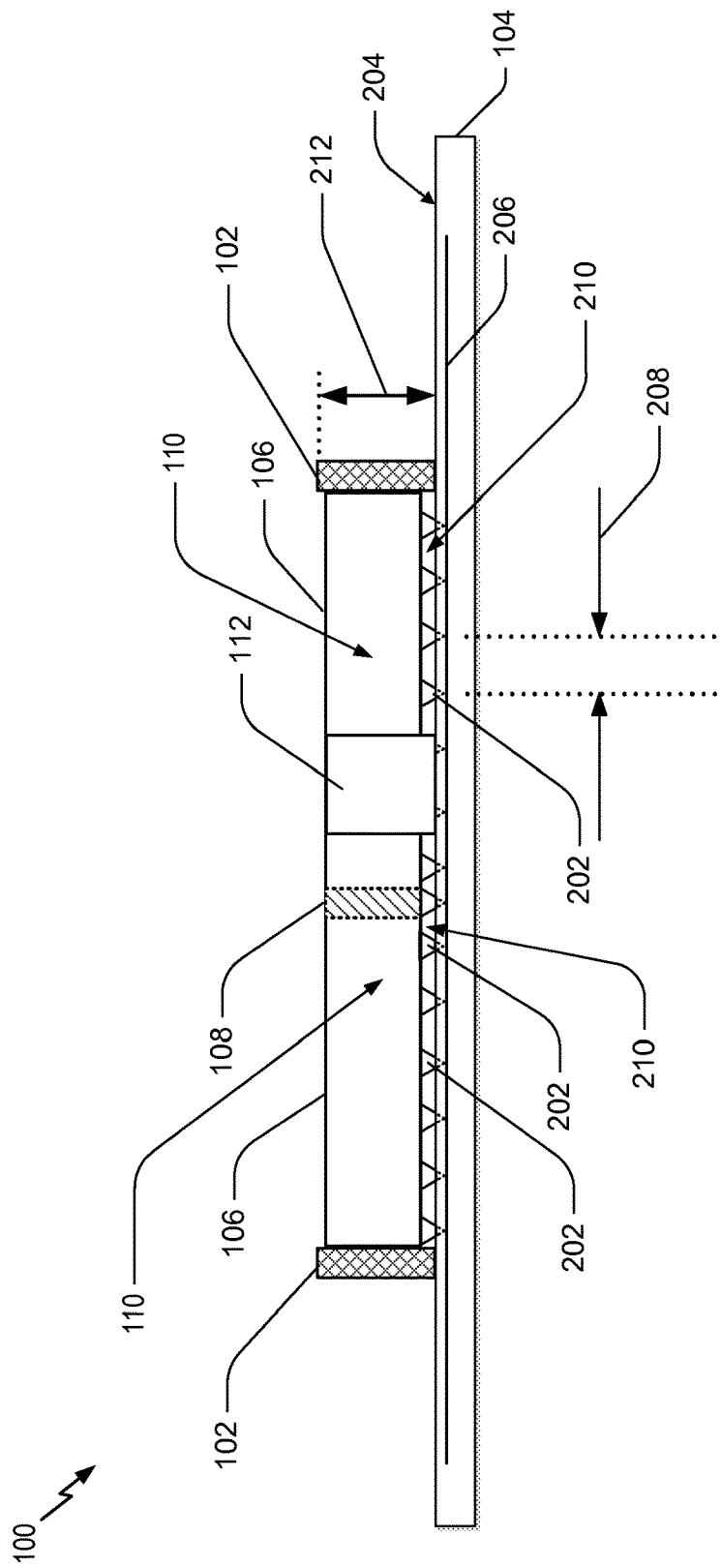
FIG. 2 is a cross-sectional side view of the apparatus of FIG. 1.

FIG. 2 illustrates a cross-sectional side view of apparatus 100 of FIG. 1 along section line 2-2 from FIG. 1. This side view illustrates that each of the shielding walls 106, 108 includes a plurality of electrical connection points or "teeth" 202 on a side facing a surface 204 of the circuit board 104. The teeth 202 are electrically conductive and are configured with a topology to sufficiently enable the teeth to pierce surface 204 and penetrate into the circuit board 104 in order to electrically couple the walls 106, 108 with a ground trace or plane 206 within the circuit board 104. This ensures that the walls 106 are electrically connected to ground to, in turn, ensure that a shielding compartment formed by electrically conductive and coupled walls, ground plane 206, and a further conductive, conformal shielding cover or material (to be discussed later) is grounded for effectuating a Faraday cage to shield circuit components (e.g., 112) from EMI or to contain EMI. One skilled in the art will appreciate that fewer or greater numbers of teeth might be utilized for making electrical contact, contingent upon the particular wavelengths of the attendant EMI. That is, the teeth 202 are spaced with a predetermined spacing 208 between each of the plurality of teeth 202 that ensures that the expected wavelength of the EMI radiation will not leak through openings or gaps 210 between the conductive teeth 202 or, at least will be attenuated. Additionally, according to an aspect, the spacing 208 may be sized to allow conformal molding material (to be discussed later) to flow in and through the gaps 210. In still another aspect, the ground plane 206 may alternatively have one or more vias (not shown) or similar connections extending up through the circuit board 104 toward surface 204 that are configured in a pattern to match the plurality of teeth 202 to make contact therewith.

As mentioned above, each circuit component 112 may include a surface mount technology (SMT) component. Since the component 112 extends above the surface 204 of circuit board 104, the print mold stencil 102 may have a wall height 212 equal to or greater than a height of a tallest circuit component within any shielded area. For example, the wall height 212 may be configured to be slightly greater than the height of the tallest circuit component within any shielded volume 110. In an alternative aspect, wall height 212 could be equal to or less than a height of a tallest circuit component within any shielded area 110. For example, in this aspect an additional removal process, such as laser removal, may be applied to the flat molding produced by the print molding process to remove the molding materials to form different heights. Although illustrated as having a constant wall height, stencil 102 may have multiple or varying wall heights. Further, each shielding wall 106, 108 may have a wall height equal to or less than the wall height 212 of print mold stencil 102.

In an aspect, the process of making a conformal shielded circuit using apparatus 100 includes filing at least a portion of the interior volume of stencil 102 with a molding material. The molding material encompasses at least one of the circuit components, such as circuit component 112 within the shielding compartment 110. As may be seen in FIG. 3, molding material 302 (the material indicated with hashed lines) is added to and fills at least part of the shielding volumes or compartments 110 defined by the stencil 102 and the shielding walls 106, 108, as well as encompassing the circuit components (e.g., 112). In an aspect, the molding material 302 may be added to the volume inside the print molding stencil 102 via a printing molding process. The molding material 302 may include, but is not limited to, epoxy molding compounds, such as Semiconductor Encapsulation Material made by Panasonic, a dielectric material, a silicone, and any other material used for chip encapsulation. In some aspects, for example, molding material 302 may have a first state where the molding material is able to flow or is relatively malleable, and a second state where the material becomes relatively solid, rigid, or stable, such as a cured state. In other aspects, the transition from the first state to the second state may be triggered by one or more of temperature, pressure, a chemical reaction, radiation exposure (such as ultra-violet light), etc. Additionally, in some aspects molding material 302 may be a material to which a shielding material layer may adhere, as will be described in more detail below.

Figure 3:
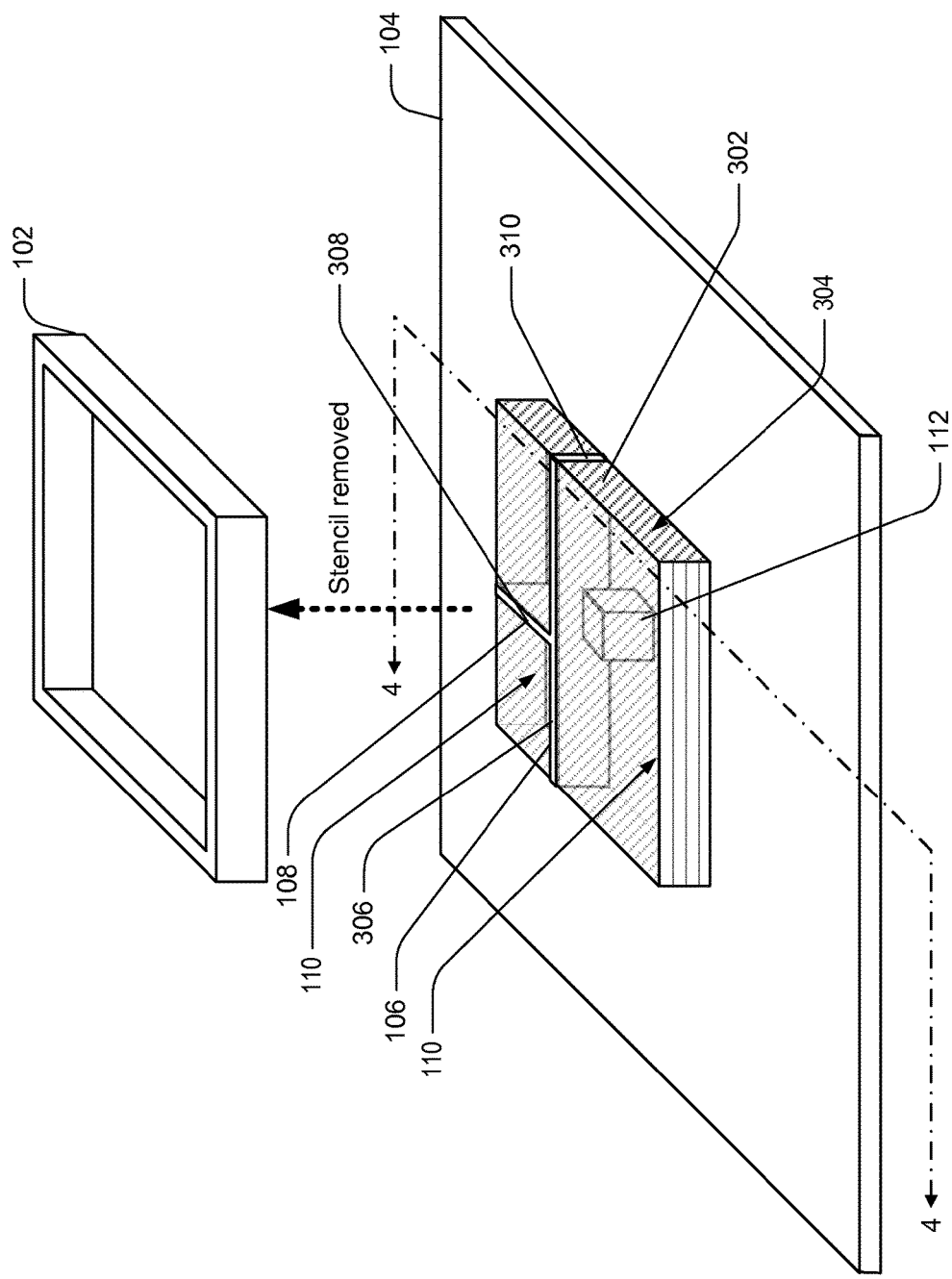
FIG. 3 is a trimetric view of an encapsulated volume(s) resulting from filling of the print mold stencil of FIG. 1 with a molding material.

In the example of FIG. 3, molding material 302 may fill each shielded compartment 110 up to a height of the print molding stencil 102. As a result, circuit components therein (e.g., circuit component 112) may be partially or fully encompassed or encapsulated by molding material 302. Where the height of the print molding stencil 102 is greater than a height of circuit component 112, the circuit components may be completely encompassed or encapsulated by molding material 302. According to another aspect, when the height of stencil 102 is equal to or less than a height of particular circuit components, those components may be at least partially encompassed or encapsulated by molding material 302, for example, leaving a top surface and, optionally, one or more side surfaces of circuit component 112 exposed and uncovered by molding material 302. Moreover, molding material 302 may flow between spaces between any circuit components, such as circuit component 302, and circuit board 104, as well as in spaces between the one or more shielding walls 106, 108 and circuit board 104 (e.g., spaces 210).

Additionally, the process of filling process may be performed below a temperature that may damage or affect a performance quality of one or more circuit components, such as circuit component 112. In one aspect, but not limited thereto, filling print mold stencil 102 with molding material 302 (FIG. 1, Block 16) may be performed substantially at room temperature, e.g., at a temperature in a range of about 15° C. to about 40° C. in a process called printing molding, where the molding material is applied through printing over a stencil. In another aspect, for example, filling print mold stencil 102 with molding material 302 (FIG. 1, Block 16) may be performed at a temperature in a range of about 120° C. to about 140° C. in a process called transfer molding, where injection molding technology is used.

In some aspects, if the print mold stencil 102 is filled with the molding material 302 in a vacuum, an underfilling process (i.e., the process to ensure underfill of epoxy or other molding material under the circuit components) might not be needed. In another aspect, an injection molding process may be utilized to fill the stencil 102. Such processes, however, must be performed after an underfilling process. It is noted that the conventional underfilling process uses an epoxy resin, e.g., the molding material, which is dispensed after solder bump reflow and uses capillary effects to force the resin to flow underneath the circuit components and to fill the gap between the circuit components and the circuit board, or between circuit board packages. For example, in a conventional underfilling process, the epoxy is injected under ball grid array (BGA) packages and package-on-package (PoP) stacks to remove air pockets. In other θwords, the underfilling process is used to remove all the air pockets inside the encapsulated structure, so that the molded device does not explode when being heated in subsequent SMT processing, for example. Thus, the present printing molding process can be performed under vacuum, thereby avoiding an underfilling process, although it is noted that the underfilling process might still be performed with a printing molding process that is not performed under vacuum, but rather performed without vacuum such as at atmospheric pressure as one example.

After stencil 102 is filed, the molding material 302 may be cured by exposure to a prescribed temperature and pressure for a prescribed time period. For example, molding material 302 could be cured at room temperature and at atmospheric pressure, or at room temperature and in a vacuum. As one example, molding material 302 could be cured at any temperature in a range of about 15° C. to about 40° C. In another example, curing may be performed at a temperature in the range of 100° C. to 180° C. It will be appreciated by those skilled in the art that the particular time for curing the molding material 302 may vary depending on one or more of the temperature, the pressure, and the particular composition of the molding material 302. Curing of molding material 302 may be considered finished achieved when the material 302 has become relatively solid, rigid and/or stable.

As further illustrated in FIG. 3, the print mold stencil 102 may be removed after curing, or at least when the molding material 302 is stable enough to maintain the shape or topology defined by the stencil 102. The resultant state of the apparatus illustrated in FIG. 3 after curing is an encapsulated volume in the at least one shielded compartment, wherein the encapsulated volume includes the molding material, circuit components, and at least a portion of the shielding wall(s) 106, 108. For removal, print mold stencil 102 is separated from the one or more shielding walls, e.g. shielding walls 106, 108 and the molding material 302. In an aspect, print mold stencil 102 may be removed by a machine, such as a pick-and-place machine or any machine capable of holding, positioning, and removing print mold stencil 102. In another aspect, for example, print mold stencil 102 may be removed by physically separating print mold stencil 102 from the one or more shielding walls and the molding material 302, by various processes including, but not necessarily limited to, a dicing or cutting operation, including sawing or laser cutting. In still other aspects, for example, print mold stencil 102 may be physically destroyed, disintegrated, and/or evaporated, such as with a laser, thereby separating the print mold stencil 102 from contacting the one or more shielding walls, as well as the molding material 302. As a result of removing print mold stencil 102, an encapsulated volume 304 is formed that includes at least a portion of the shielding walls 106, 108, any circuit components (e.g., 112), and the molding material 302.

As may be further seen in FIG. 3, in an aspect the top edges (e.g., 306, 308), and side edges (e.g., 310) of the shielding walls may be exposed at surfaces of the encapsulated volume 304. This exposure affords electrical coupling of the shielding walls 106, 108 to an applied conductive cover material or shielding material layer (to be discussed later) covering the exposed surfaces of volume 304, and better ensure minimization of EMI leaking into or from the shielding volumes 110, as well as EMI leakage between the various compartments 110 in the apparatus. According to some aspects, exposure of the surfaces 306, 308, 310 might involve removing a portion of the molding material 302 after curing and prior to forming the shielding material layer when the height of molding material 302 is greater that the height of the shielding walls 106, 108. In such cases, removal of material 302 may be accomplished with, but not limited to, polishing or laser burning. According to further, alternative aspects, a channel or trench (not shown) may be formed in molding material 302 to expose the top surfaces of the one or more shielding walls 106, 108.

Figure 4:
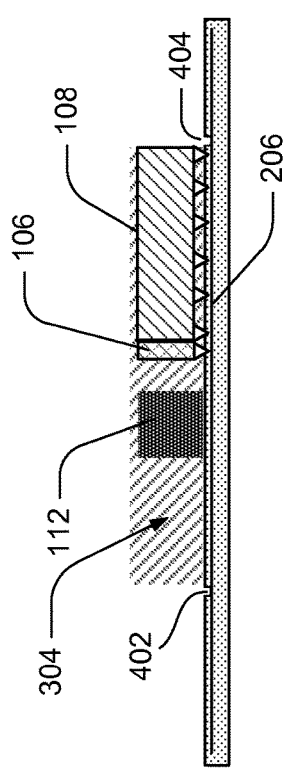
FIG. 4 is a partial cross-sectional side view of the structure of FIG. 3 prior to application of a shielding material layer.

As mentioned before, an electrically conductive shielding material layer is added to the outside surface of encapsulated volume 304 to complete EMI shielding (e.g., to form a Faraday cage). In an aspect, prior to application of the shielding material layer, means may be provided by which the applied shielding layer may make sufficient electrical contact with the ground plane 206 in the PCB 102. In one example illustrated in FIG. 4, which is a partial cross sectional view along line 4-4 shown in FIG. 3. As illustrated, trenches or etchings 402, 404 may be formed or cut around the encapsulated volume 302 and through the PCB 104 to a sufficient depth to expose the ground plane 206. In an aspect, the trenches or etchings 402, 404 may be formed by laser etching or saw etchings, as merely a couple of examples. Accordingly, when the shielding material layer is applied, a portion of the layer extends into or fills the trenches 402, 404 to provide electrical coupling with ground plane 206. It is noted, however, that the example of FIG. 4 is merely exemplary, and that, alternatively a surface trace could be disposed on the surface of PCB 104 (not shown) corresponding to approximately the interior perimeter of stencil 102. The surface trace could then further be electrically coupled to the ground 206 using a number of conductive vias extending through the PCB (not shown), as one example. The shielding material would then be deposited on the volume 304 and in electrical contact with such surface trace.

Figure 5:
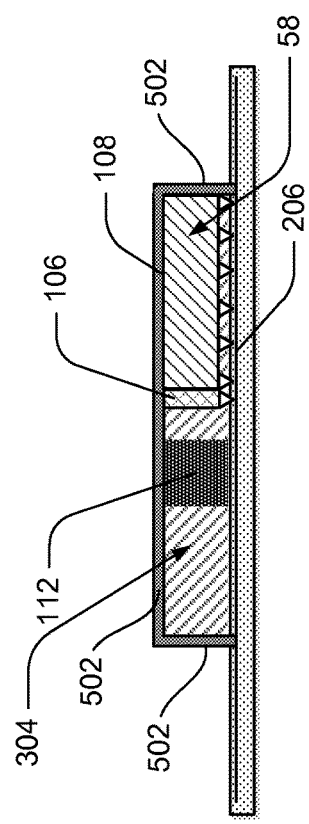
FIG. 5 is a partial cross-sectional side view of the structure of FIG. 3 after application of a shielding material layer, thereby forming one or more shielding compartments each containing the one or more circuit components, and defining a chip having a conformal interference shielding structure.

FIG. 5 illustrates the same cross sectional view as FIG. 4 after the shielding material layer 502 is applied to encapsulated volume 304. The shielding layer 502 is applied over the top and side surfaces of encapsulated volume 304, and is also configured to electrically couple with the exposed surfaces of shielding walls, e.g. 306, 308, and the ground plane 206 to form the one or more shielded compartments, such as shielded compartments 504 and 506, which are completely enclosed with conductive elements to form a Faraday cage that either contains internally generated EMI or blocks external EMI. In some aspects, the various circuit components mounted to PCB 104, such as circuit component 112, are then contained within one or more shielded compartments 306, 308, and also may define one or more chips, including a system on a chip (SoC).

It is noted that the shielding layer 502 may include any number of various conductors that may be applied to circuit components. In one example, layer 502 may be an electrical conductive material such as a conductive thin film or conductive paint applied with physical vapor deposition processes, such as sputter deposition. The material used for layer 502 may include, but is not limited to, one or more of silver oxides or other metal oxides such as zinc oxide, tin oxide or titanium oxide. It is further noted that although the illustrated examples of FIG. 1-5 illustrate a PCB 104 having an area larger than the footprint area of the encapsulated volume 302 (including layer 502 as well), the PCB 104 substrate may be cut to an area at least approximately equal to the footprint area of the encapsulated volume 304 to form a system on a chip or similar chip device.

Figure 6:
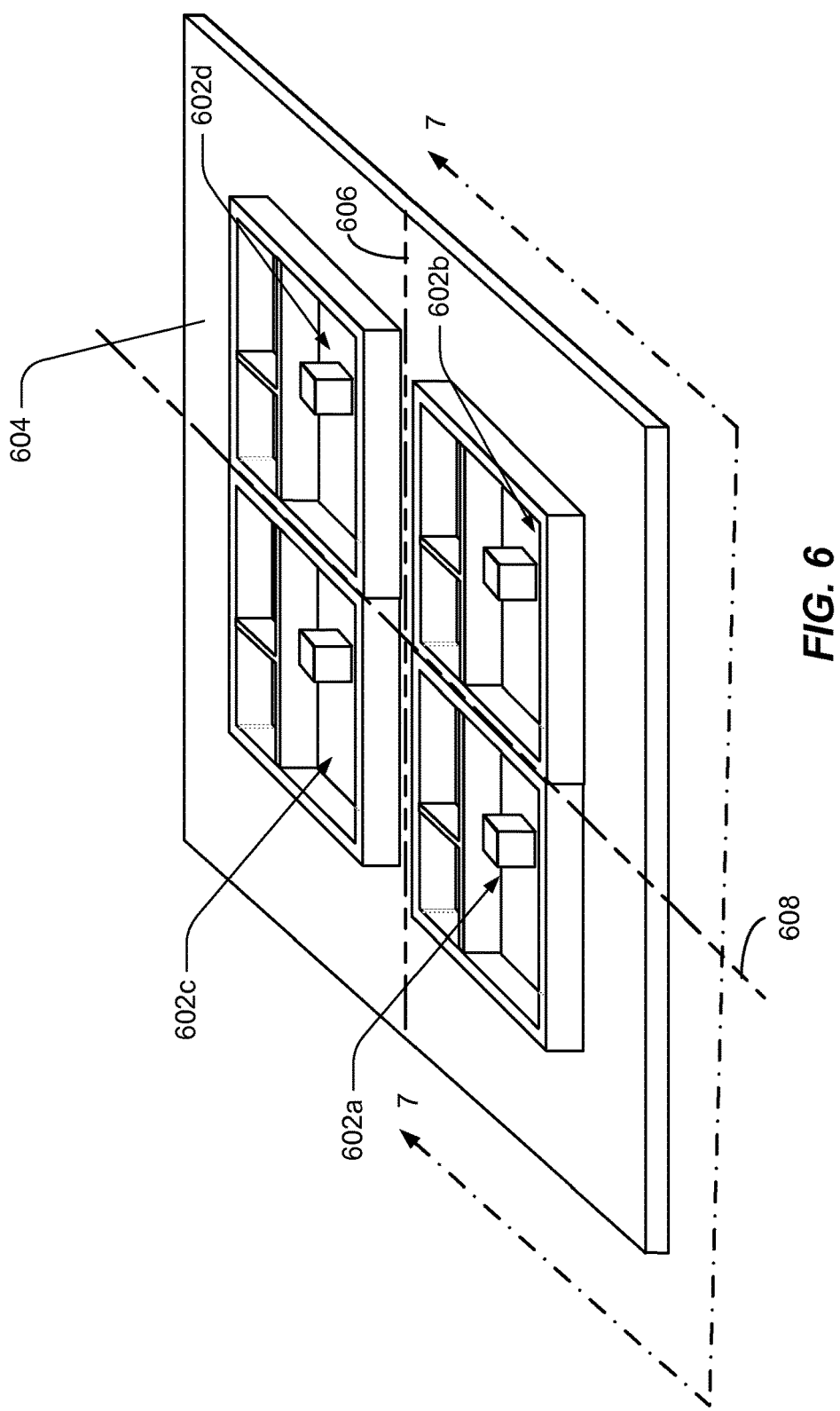
FIG. 6 illustrates a trimetric view of another example apparatus for providing conformal shielding for a plurality of shielded and encapsulated circuits.

In still another aspect, the apparatus described in connection with FIGS. 1-5 may be repeated on a PCB substrate for production of multiple chips or apparatus, such that the multiple apparatus are disposed on a larger circuit board or substrate. In this aspect, as illustrated by FIG. 6, multiple chip apparatus 602a-602d are disposed on a PCB substrate 604. In an aspect apparatus 602 are configured in the same manner as apparatus 100 in FIGS. 1-5 wherein a stencil with embedded interior shielding walls is placed over corresponding circuitry on the PCB, print molded, and the stencil then subsequently removed. The distinct chip apparatus 602 are then separated such as with saw cutting along lines 606, 608, as merely one example of how to achieve such separation. It is further noted that the example of FIG. 6 illustrates that the positioning of the chips 602 relative to each other on substrate 604 may be abutting, such as with chips 602a and 602b, or may have spacing there between such as with chips 602a and 602c.

Figure 7:
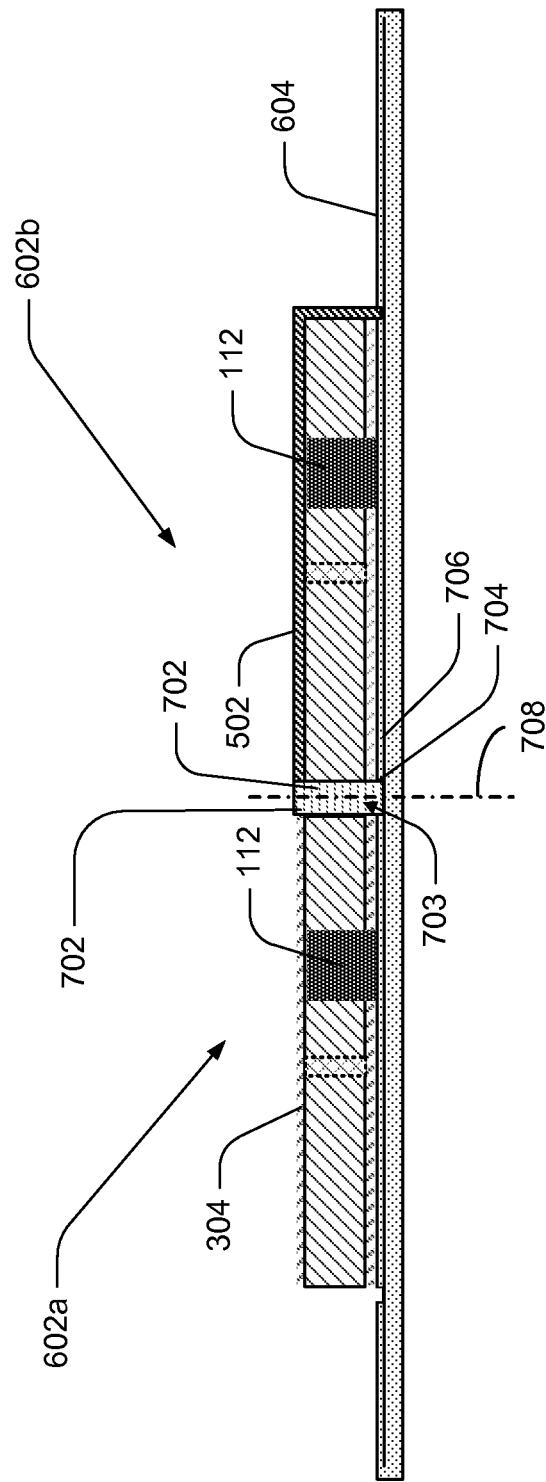
FIG. 7 illustrates a cross-sectional view of the structure of FIG. 6.

FIG. 7 illustrates a cross-sectional view of the arrangement of FIG. 6 along line 7-7 after removal of the stencils. As may be seen in this illustration, when the stencils are removed after application and curing of the molding material 302, a conductive material 702, such as a silver paste, may be applied in the space 703 between the chips 602a and 602b and also adhere to the sides of the encapsulated volume of chips 602. Additionally, in an aspect the conductive material 702 may be applied such that it extends into trenches or etchings 704 that extend into the substrate 604 to the ground plane 706 allowing material 702 to electrically couple with the ground plane 706.

When the chips 602a and 602b are separated, a cut may be made through the conductive material 702 between the two chips, as indicated by line 708. In a further aspect, the width of the space in which material 702 is disposed may be configured to be slightly larger than a saw blade width. For example, for a 0.2 mm saw blade width, the width of space 703 and the material 704 filing the space may be 0.4 mm. FIG. 7 also illustrates that cutting could be performed before deposition of the shielding material layer (See e.g., chip unit 602a on the left side of FIG. 7), or after deposition of the layer 502 (See chip unit 602b on the right side of FIG. 7). Additionally, FIG. 7 illustrates that layer 502 may be disposed in electrical contact with conductive material 702, wherein material 702 makes up at least a portion of the shielding layer for shielding the chip unit 602. Of final note, the illustration in FIG. 7 has been shown omitting the shielding wall electrical connection points or "teeth" 202 for simplicity of illustration.

It is further noted according to another aspect that instead of chips 602 formed with respective stencils as illustrated in FIG. 6, in other examples a larger stencil (not shown) could be used to form multiple numbers of chips, where the stencil encompasses an area of two or more chips and has numerous shielding walls embedded in an interior volume. The multiple shielding walls therein would be used to define shielded volumes for multiple chips. In still another aspect of this example, the multiple chips 602 of FIG. 6 may be considered as one unit such that the stencil encloses all of the units 602 as one chip with the internal shielding walls (e.g., 106, 108) applied as described before. Thus, one skilled in the art will appreciate that at least a portion of the chip units 602 within such a single, larger stencil would not be defined by stencil walls when the molding material is applied within the stencil volume; such as where two units have abutting or shared edges or boundaries. This example of a larger stencil may be beneficial for saving material cost and increasing the efficiency of panel usage. A laser or saw cut, as described before, may be used to form trenches along abutting chip boundaries to allow silver paste application there between. In a further aspect of this example, four or more chip apparatus may be considered as one unit so that the single print mold stencil will enclose the four chip units as one chip with internal walls applied in the manner as discussed before.

Figure 8:
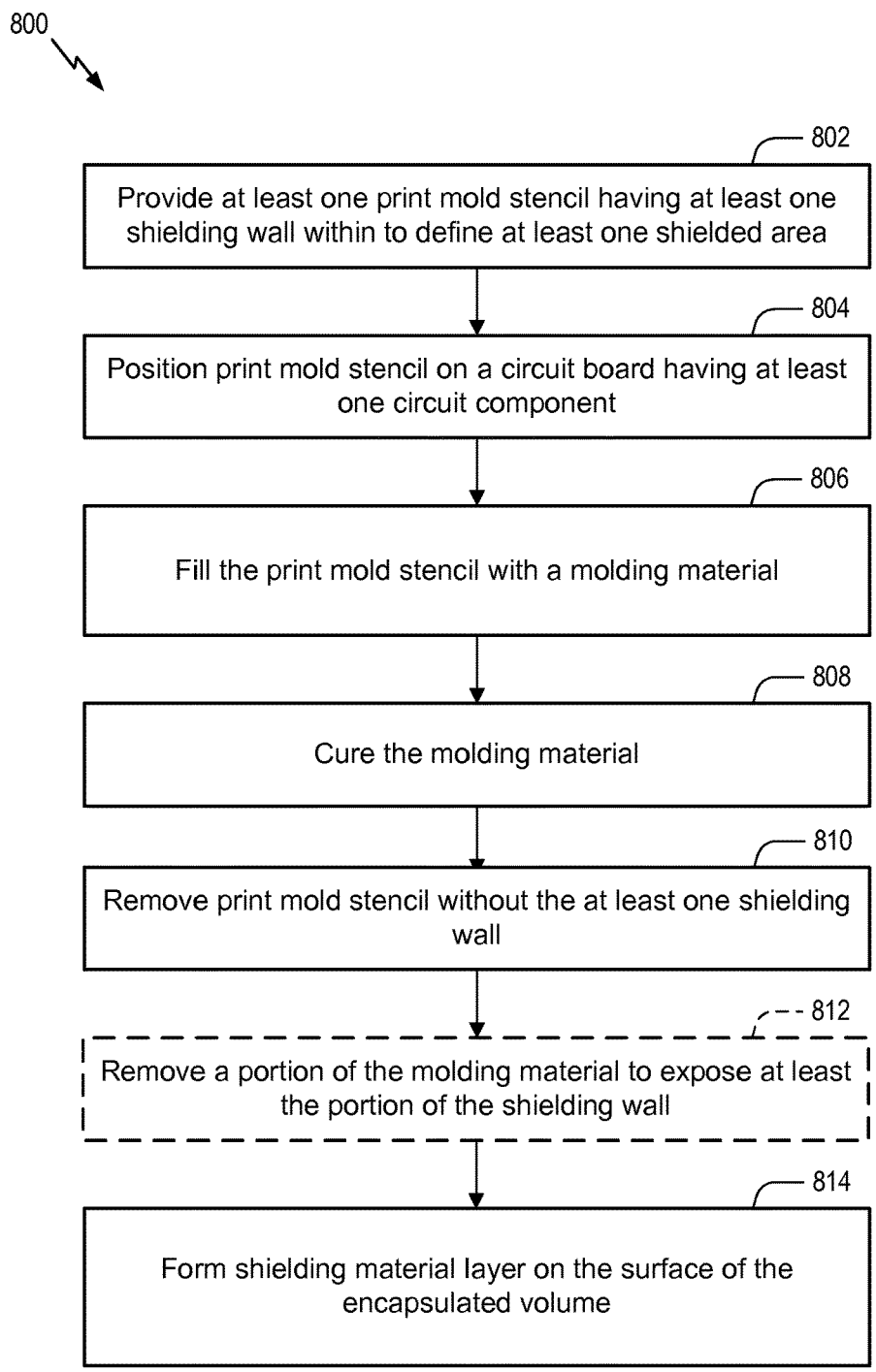
FIG. 8 is a flowchart of an exemplary method of making a conformal interference shielding structure.

FIG. 8 illustrates a method 800 for providing conformal shielding according to the present disclosure. In a particular aspect, method 800 is utilized with the apparatus described in connection with FIGS. 1-5, but is not necessarily limited to such. Method 800 includes providing at least one print mold stencil having at least one shielding wall within to define at least one shielded area as shown by block 802. As described before, providing a stencil, such as stencil 102, with one or more shielding walls (e.g., 106, 108) embedded in the interior volume of the stencil affords quick application of surfaces used to form shielding compartments (110). Furthermore, it again noted that the print mold stencil is configured to be fillable in at least a portion defined with the at least one shielding wall with a molding material such that at least one of the circuit components in the at least one shielded area may be encapsulated by a volume of the molding material. The so provisioned stencil is then positioned on a circuit board (e.g., 104) that has one or more circuit components mounted thereto (e.g. 112) as indicated in block 804. In an aspect, the positioning of the stencil in block 804 includes ensuring that the electrical connection points (e.g., teeth 202) on the portions of the shielding walls that engage the PCB extend through the PCB and make electrical contact with a ground plane (e.g., 206). In an aspect, the teeth may be extended through the top surface of the PCB to the ground plane via applied pressure where the teeth penetrate through the circuit board due their pointed structure.

After the positioning in block 804, the interior volume of the print mold stencil is then filled with molding material as shown by block 806. For the sake of brevity, it is noted that the processes for filling the stencil with the molding material may be effectuated by any of numerous processes described before in connection with FIG. 3. In aspect, the molding material is of sufficient volume to encompass the circuit components within each of the shielding compartments (e.g., 110) that are defined by the stencil (102) and the shielding walls (106, 108). As described before, however, certain aspects of the present disclosure also contemplate circuit components in the shielded volume that are at least partially encompassed by the molding material. Additionally, the molding material is composed of any one of various materials as described before. Still further, it is noted that, in an aspect, the spacing 208 between the spaced apart teeth 202 is configured to allow the molding material to flow into the spacing between the teeth.

After filling of the print mold stencil with the process of block 806, the molding material is cured (block 808), and the print mold stencil is removed without the at least one shielding wall (block 810). As discussed previously, the print mold stencil may be removed using a number of different processes, including, but not limited to, dicing or laser burning.

The result of the processes of blocks 802 through 810 is an encapsulated volume (e.g., 304), which includes the shielding walls to, in part, define one or more shielded compartments (e.g., 110). In a further aspect, method 800 may include an additional process of removing a portion of the molding material to expose portions of the shielding walls as indicated by block 812 if the result of the filling process 806 yields a volume of molding material that fully encompasses the walls. This process of block 812 ensures that the conductive surfaces of the shielding walls are exposed to make sufficient electrical contact with a deposited shielding material layer to be applied (See e.g., block 814).

At block 814 a shielding material layer (e.g., 502) is formed or deposited on the exposed surfaces of the encapsulated volume and in electrical contact with at least the exposed portions of the shielding wall to define a shielded compartment (e.g., 110) on the circuit board that surrounds at least one circuit component (e.g., 112). As described earlier, the shielding material layer is also extended into trenches, etchings, or some other similar means within the PCB in order to ensure contact with the ground plane (e.g., 206) in the PCB so as to complete the shielded compartment for effective containment of or protection from EMI. As also described before, the shielding material layer may be applied using physical vapor deposition processes, such as sputter deposition or plasma deposition.

It is noted that while the above-disclosed aspects were discussed primarily with reference to print molding, and a print mold stencil, these aspects may likewise apply to a transfer molding process using a stencil, form, mold, or any other structure to perform the function corresponding to the described print mold stencil. For example, for transfer molding, the process is similar to injection molding, where the molding material is a liquid plastic material that is injected into the molded areas, e.g., the stencil or shielded areas described above, at high temperature and pressure. The molding material is then cured, for example in an oven or in a heated mold, to solidify. Then the molds, and/or the stencil or form, may be removed for shielded layer application, thereby resulting in the electrical device, such as a chip, having a conformal shielding structure as described herein.

In light of the foregoing discussion, one skilled in the art will appreciate that the disclosed apparatus and methods afford an improved manufacture of conformal interference shielding structures. In one aspect, providing a print molding stencil with preset embedded shielding walls affords ease of positioning and saves time of manufacture by eliminating the need to either mount shielding walls beforehand or separately cut or etch the conformal shielding and apply conductive material to form shielding walls afterwards. Additionally, the provided stencil with preset shielding walls affords better minimization of circuit board area and height over the conventional method of presetting walls on the PCB prior to applying the conformal shielding.

It is noted that the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, the word "exemplary" is used herein to mean "serving as an example, instance, or illustration." Any embodiment described herein as "exemplary" is not necessarily to be construed as preferred or advantageous over other embodiments.

While the foregoing disclosure discusses illustrative aspects and/or embodiments, it is noted that various changes and modifications could be made herein without departing from the scope of the described aspects and/or embodiments as defined by the appended claims. Furthermore, although elements of the described aspects and/or embodiments may be described or claimed in the singular, the plural is contemplated unless limitation to the singular is explicitly stated. Additionally, all or a portion of any aspect and/or embodiment may be utilized with all or a portion of any other aspect and/or embodiment, unless stated otherwise.

It is understood that the specific order or hierarchy of steps in the processes disclosed is merely an example of exemplary approaches. Based upon design preferences, it is understood that the specific order or hierarchy of steps in the processes may be rearranged while remaining within the scope of the present disclosure. The accompanying method claims present elements of the various steps in a sample order, and are not meant to be limited to the specific order or hierarchy presented.

The steps of a method or algorithm described in connection with the embodiments disclosed herein may be effected with a computer controlled device, where the method or algorithm is embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus for providing conformal shielding, comprising:
   a circuit board;
   a plurality of circuit components mounted on the circuit board; and
   a plurality of shielded compartments connected to the circuit board, each of the plurality of shielded compartments encompassing one or more circuit components of the plurality of circuit components, wherein each of the plurality of shielded compartments comprises a molding material, at least one shielding wall within a portion of the molding material, and a shielding material layer disposed on at least a portion of the molding material and configured to electrically coupled with a portion of the at least one shielding wall, wherein for each of the plurality of shielded compartments, the shielding material layer is disposed on a top surface and a side surface of the molding material of the shielded compartment, and wherein the molding material encompasses at least a portion of the body of at least one circuit component and is integrally formed on the circuit board with the at least one shielding wall;
   wherein each of the plurality of shielded compartments is separated from an adjacent one of the shielded compartments by a space containing a conductive material adhered to at least one side of the shielded compartment and the adjacent shielded compartment.

2. The apparatus of claim 1, wherein the plurality of shielded compartments define a plurality of pairs of adjacent shielded compartments, the adjacent shielded compartments in each pair being separated from each other by a space.

3. The apparatus of claim 2, wherein the plurality of shielded compartments define a plurality of distinct chip apparatus configured to be separated from each other by cutting the circuit board.

4. The apparatus of claim 3, wherein:
   at least a portion of the conductive material is disposed in a trench between at least two of the distinct chip apparatus, and is configured to be cut to separate the at least two chip apparatus.

5. The apparatus of claim 2, wherein the at least one shielding of each of the plurality of shielded compartments includes a bottom surface having spaced-apart teeth, and wherein the teeth are configured to electrically couple the at least one shielding wall to at least a portion of the circuit board.

6. The apparatus of claim 5, wherein the plurality of shielded compartments define a plurality of distinct chip apparatus configured to be separated from each other by cutting the circuit board.

7. The apparatus of claim 5, wherein the spaced-apart teeth define a spacing between the teeth that inhibits or attenuates leakage of electromagnetic radiation through the spacing.

8. The apparatus of claim 7, wherein the spacing corresponds with a wavelength of inhibited or attenuated electromagnetic radiation.

9. The apparatus of claim 5, wherein the circuit components are mounted on a surface of the circuit board, and the at least a portion of the circuit board comprises a ground plane disposed within the circuit board, and having a plurality of electrical connection points below the surface of the circuit board and engaged with the spaced-apart teeth.

10. The apparatus of claim 5, wherein the spaced-apart teeth extend through a top surface of the circuit board and engage a ground plane disposed within the circuit board and below the top surface of the circuit board.

11. The apparatus of claim 5, wherein at least some of the molding material is located within a spacing between the spaced-apart teeth.

* * * * *